(12) United States Patent
Narukawa et al.

(10) Patent No.: US 10,354,864 B2
(45) Date of Patent: Jul. 16, 2019

(54) COMPOUND SEMICONDUCTOR SUBSTRATE WITH SIC LAYER

(71) Applicant: AIR WATER INC., Chuo-ku, Sapporo-shi, Hokkaido (JP)

(72) Inventors: Mitsuhisa Narukawa, Nagano (JP); Akira Fukazawa, Nagano (JP); Hiroki Suzuki, Nagano (JP); Keisuke Kawamura, Nagano (JP)

(73) Assignee: Air Water Inc., Hokkaido (JP)

( * ) Notice: Subject to any disclaimer, the term of this patent is extended or adjusted under 35 U.S.C. 154(b) by 0 days.

(21) Appl. No.: 15/761,841

(22) PCT Filed: Oct. 17, 2016

(86) PCT No.: PCT/JP2016/080702
§ 371 (c)(1),
(2) Date: Mar. 21, 2018

(87) PCT Pub. No.: WO2017/069087
PCT Pub. Date: Apr. 27, 2017

(65) Prior Publication Data
US 2018/0277363 A1    Sep. 27, 2018

(30) Foreign Application Priority Data

Oct. 21, 2015 (JP) ................. 2015-207258

(51) Int. Cl.
| | |
|---|---|
| *H01L 31/0328* | (2006.01) |
| *H01L 31/0336* | (2006.01) |
| *H01L 21/02* | (2006.01) |
| *C23C 16/34* | (2006.01) |
| *H01L 29/778* | (2006.01) |
| *H01L 29/812* | (2006.01) |

(Continued)

(52) U.S. Cl.
CPC ........ *H01L 21/02447* (2013.01); *C23C 16/34* (2013.01); *H01L 21/0254* (2013.01);
(Continued)

(58) Field of Classification Search
CPC ........ H01L 21/02447; H01L 21/02381; H01L 21/0254

See application file for complete search history.

(56) References Cited

U.S. PATENT DOCUMENTS

| | | |
|---|---|---|
| 2008/0220555 A1 | 9/2008 | Saxler et al. |
| 2013/0062612 A1 | 3/2013 | Shioda et al. |

(Continued)

FOREIGN PATENT DOCUMENTS

| | | |
|---|---|---|
| JP | 2010-521065 A | 6/2010 |
| JP | 2013-070013 A | 4/2013 |

(Continued)

OTHER PUBLICATIONS

International Search Report, dated Nov. 8, 2016, in International Patent Application No. PCT/JP2016/080702.

(Continued)

*Primary Examiner* — Hsien Ming Lee
(74) *Attorney, Agent, or Firm* — Wood, Phillips, Katz, Clark & Mortimer (57) ABSTRACT

A compound semiconductor substrate having a desired quality is provided.

A compound semiconductor substrate has an SiC (silicon carbide) layer, an AlN (aluminum nitride) buffer layer formed on the SiC layer, an Al (aluminum) nitride semiconductor layer formed on the AlN buffer layer, a first GaN (gallium nitride) layer formed on the Al nitride semiconductor layer, a first AlN intermediate layer formed on the first GaN layer in contact with the first GaN layer, and a second GaN layer formed on the first AlN intermediate layer in contact with the first AlN intermediate layer.

5 Claims, 5 Drawing Sheets

(51) Int. Cl.
  *H01L 33/32* (2010.01)
  *H01L 29/10* (2006.01)
  *H01L 29/20* (2006.01)
  *H01L 29/205* (2006.01)
  *H01L 29/66* (2006.01)
(52) U.S. Cl.
  CPC .... *H01L 21/0262* (2013.01); *H01L 21/02381* (2013.01); *H01L 21/02458* (2013.01); *H01L 21/02502* (2013.01); *H01L 29/1029* (2013.01); *H01L 29/2003* (2013.01); *H01L 29/205* (2013.01); *H01L 29/66431* (2013.01); *H01L 29/778* (2013.01); *H01L 29/7787* (2013.01); *H01L 29/812* (2013.01); *H01L 33/32* (2013.01)

(56) References Cited

U.S. PATENT DOCUMENTS

| | | | | |
|---|---|---|---|---|
| 2013/0075786 | A1* | 3/2013 | Ishiguro | H01L 29/7783 257/194 |
| 2014/0084338 | A1 | 3/2014 | Harada et al. | |
| 2015/0111369 | A1 | 4/2015 | Kim et al. | |
| 2015/0221728 | A1* | 8/2015 | Hikosaka | H01L 21/0254 257/76 |

FOREIGN PATENT DOCUMENTS

| | | |
|---|---|---|
| JP | 2013-70065 A | 4/2013 |
| JP | 2013-179121 A | 9/2013 |
| JP | 2014-063903 A | 4/2014 |
| JP | 2015-082662 A | 4/2015 |
| WO | 2008/112097 A2 | 9/2008 |

OTHER PUBLICATIONS

International Preliminary Report on Patentability, dated May 3, 2018, in International Patent Application No. PCT/JP2016/080702.
Office Action dated Apr. 18, 2019 in Japanese Patent Application No. 2017-546541.
Extended European Search Report dated May 24, 2019 in European Patent Application No. EP 16 85 7402.

* cited by examiner

COMPOUND SEMICONDUCTOR SUBSTRATE WITH SIC LAYER

TECHNOLOGICAL FIELD

The present invention relates to a compound semiconductor substrate, and more particularly, to a compound semiconductor substrate provided with a SiC (silicon carbide) layer.

DESCRIPTION OF THE RELATED ART

GaN (gallium nitride) is known as a wide band gap semiconductor material with a larger band gap and higher insulation breakdown field strength than Si (silicon). Since GaN has higher insulation breakdown resistance than other wide band gap semiconductor materials, it is expected to be applied to next generation low loss power devices.

When an Si substrate is used as a starting substrate (a foundation substrate) of a semiconductor device using GaN, there are a large difference of the lattice constant and a large difference of the coefficient of thermal expansion, between GaN and Si. Due to these differences, phenomena such as warpage occurring on the substrate and cracking in the GaN layer are likely to occur.

As a countermeasure to the warpage of the substrate and the occurrence of crack in the GaN layer, for example, Document 1 below discloses a semiconductor substrate having an Si substrate, a 3C—SiC layer formed on the Si substrate, and a plurality of AlN layers (aluminum nitride) and GaN layers alternately formed.

Document 2 below discloses a nitride semiconductor element which includes an Si substrate, a foundation layer formed on the Si substrate, a stacked intermediate layer formed on the foundation layer, and a functional layer formed on the stacked intermediate layer. The foundation layer includes an AlN buffer layer and a GaN foundation layer. The stacked intermediate layer includes an AlN intermediate layer, an AlGaN (aluminum gallium nitride) intermediate layer, and a GaN intermediate layer. The AlGaN intermediate layer includes a first step layer in contact with the AlN intermediate layer. The Al compositional ratio in the first step layer decreases stepwise in the direction from the AlN intermediate layer to the first step layer.

Document 3 below discloses a substrate made of Si, SiC or the like, and layers sequentially formed on the substrate, wherein the layers are an AlN buffer layer, a foundation layer including a nitride semiconductor containing Al (aluminum) and GaN, a first high Ga (gallium) composition layer made of GaN or the like, a high Al composition layer made of AlN or the like, a low Al composition layer including a nitride semiconductor, an intermediate portion made of SiN (silicon nitride), MgN (magnesium nitride), BN (boron nitride) or the like, and a second high Ga composition layer made of GaN or the like

PRIOR ART DOCUMENT

Document(s) Related to Patents

Document 1: Japanese Unexamined Patent Publication No. 2013-179121
Document 2: Japanese Unexamined Patent Publication No. 2013-70065
Document 3: Japanese Unexamined Patent Publication No. 2014-63903

SUMMARY OF THE INVENTION

Problems to be Resolved by the Invention

According to the technique of the Document 1, occurrence of warpage of the substrate and occurrence of cracks in the GaN layer can be suppressed to some extent, and a GaN layer having relatively good crystal quality can be obtained. On the other hand, the technique of the Document 1 has a limitation in increasing the thickness of the GaN layer, and the withstand voltage has likewise been limited. This is because when thickening the GaN layer, warpage occurs in the substrate or cracks occur in the GaN layer. Considering the application of GaN as a power device, it is important to improve the withstand voltage of semiconductor devices using GaN.

According to the technique of the Document 2, the occurrence of cracks in the GaN layer can be suppressed to some extent, and a GaN layer with relatively good crystal quality can be obtained. On the other hand, the technique of the Document 2 has a problem that warpage of the substrate tends to occur.

According to the technique of the Document 3, a relatively good crystal quality of a GaN layer can be obtained. On the other hand, in the technique of the Document 3, there is a problem that warpage of the substrate or crack in the GaN layer easily occurs.

In summary, when forming a GaN layer on a substrate, there are a problem that warpage occurs on the substrate, a problem that a crack occurs in the GaN layer, a problem that crystal quality deteriorates, and a problem that the withstand voltage is low. Conventionally, a compound semiconductor substrate of quality that solves all these problems could not be obtained.

The present invention is intended to solve the above problems, and an object thereof is to provide a compound semiconductor substrate having a desired quality.

Means for Solving the Problem

According to one aspect of the present invention, a compound semiconductor substrate comprises: an SiC layer, an AlN buffer layer formed on the SiC layer, a nitride semiconductor layer containing Al, formed on the AlN buffer layer, a first GaN layer formed on the nitride semiconductor layer, a first AlN intermediate layer formed on the first GaN layer, being in contact with the first GaN layer, and a second GaN layer formed on the first AlN intermediate layer, being in contact with the first AlN intermediate layer.

Preferably, according to the compound semiconductor substrate, a compositional ratio of Al inside the nitride semiconductor layer decreases from a lower part to an upper part.

Preferably, according to the compound semiconductor substrate, the nitride semiconductor layer includes a first nitride semiconductor layer containing Al and Ga, a second AlN layer formed on the first nitride semiconductor layer, being in contact with the first nitride semiconductor layer, and a second nitride semiconductor layer containing Al and Ga, formed on the second AlN layer and being in contact with the second AlN layer, and a compositional ratio of Al in at least one of the first and second nitride semiconductor layers decreases from a lower part to an upper part.

Preferably, according to the compound semiconductor substrate, the second GaN layer includes compressive strain.

Preferably, according to the compound semiconductor substrate, the nitride semiconductor layer has a thickness of 900 nm or more and 2 μm or less.

Preferably, according to the compound semiconductor substrate, the first GaN layer has a thickness of 550 nm or more and 1000 nm or less.

Preferably, according to the compound semiconductor substrate, the first AlN intermediate layer has a thickness of 5 nm or more and 9 nm or less.

Effect of the Invention

According to the present invention, it is possible to provide a compound semiconductor substrate having a desired quality.

DETAILED DESCRIPTION OF EMBODIMENTS

First Embodiment

Figure 1:
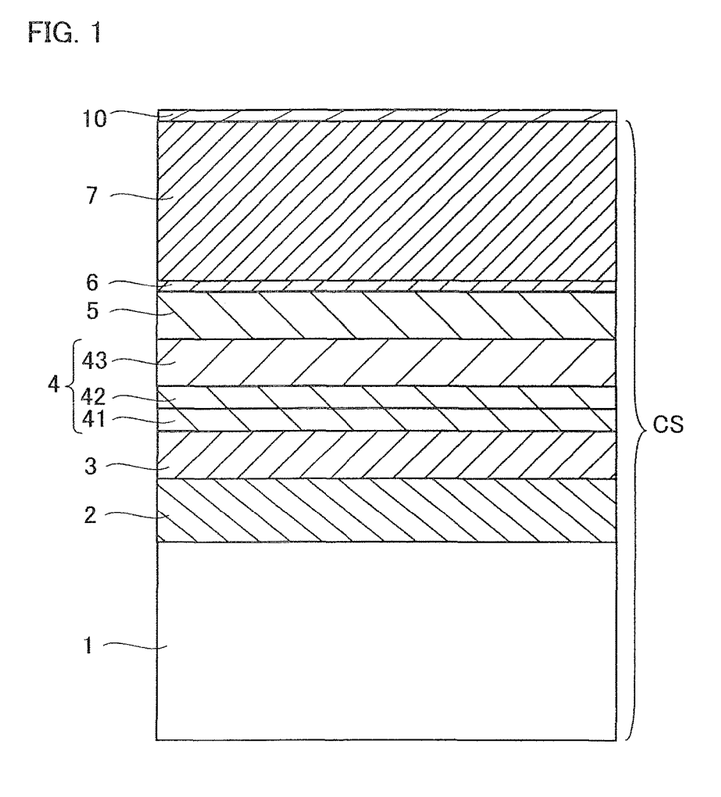
FIG. 1 is a cross-sectional view showing a configuration of a semiconductor device, according to an embodiment of the present invention.

FIG. 1 is a cross-sectional view showing a configuration of a semiconductor device, according to an embodiment of the present invention.

Referring to FIG. 1, the semiconductor device in this embodiment includes an HEMT (High Electron Mobility Transistor). The semiconductor device is provided with a compound semiconductor substrate CS and an Al nitride semiconductor layer 10 formed on the compound semiconductor substrate CS.

The compound semiconductor substrate CS is equipped with Si substrate 1, SiC layer 2, AlN buffer layer 3 (an example of an AlN buffer layer), Al nitride semiconductor layer 4 (an example of a nitride semiconductor layer containing Al), GaN layer 5 (an example of a first GaN layer), AlN intermediate layer 6 (an example of a first AlN intermediate layer), and GaN layer 7 (an example of a second GaN layer).

The Si substrate 1 is made of p+ type Si, for example. The (111) plane is exposed on the surface of Si substrate 1. Note that the Si substrate 1 may have n-type conductivity or semi-insulating property. (100) plane or (110) plane may be exposed on the surface of the Si substrate 1. The Si substrate 1 has, for example, a diameter of 6 inches and has a thickness of 900 μm.

The SiC layer 2 is in contact with the Si substrate 1, and is formed on the Si substrate 1. The SiC layer 2 is made of 3C—SiC, 4H—SiC, 6H—SiC or the like. In particular, when the SiC layer 2 is epitaxially grown on Si substrate 1, SiC layer 2 is generally made of 3C—SiC.

The SiC layer 2 may be formed by homoepitaxial growth of SiC by using MBE (Molecular Beam Epitaxy) method, CVD (Chemical Vapor Deposition) method, LPE (Liquid Phase Epitaxy) method, or the like, on the foundation layer made of SiC obtained by carbonizing the surface of Si substrate 1. The SiC layer 2 may be formed only by carbonizing the surface of the Si substrate 1. Further, the SiC layer 2 may be formed by heteroepitaxial growth on the surface of the Si substrate 1 (or with a buffer layer interposed therebetween). The SiC layer 2 is doped with, for example, N (nitrogen) and has an n-type conductivity. The SiC layer 2 has a thickness of, for example, 0.1 μm or more and 3.5 μm or less. Note that the SiC layer 2 may have a p-type conductivity or semi-insulating property.

The AlN buffer layer 3 is in contact with the SiC layer 2 and is formed on the SiC layer 2. The AlN buffer layer 3 functions as a buffer layer for relaxing the lattice constant difference between the SiC layer 2 and the Al nitride semiconductor layer 4. The AlN buffer layer 3 is formed by, for example, MOCVD (Metal Organic Chemical Vapor Deposition) method. The growth temperature of the AlN buffer layer 3 is, for example, 1000 degrees Celsius or more and 1300 degrees Celsius or less. In this case, as Al source gas, for example, TMA (Tri Methyl Aluminum), TEA (Tri Ethyl Aluminum), or the like is used. As N source gas, for example, $NH_3$ (ammonia) is used. The AlN buffer layer 3 has a thickness of, for example, 100 nm or more and 1000 nm or less.

The Al nitride semiconductor layer 4 is in contact with the AlN buffer layer 3 and is formed on the AlN buffer layer 3. The Al nitride semiconductor layer 4 is made of nitride semiconductor containing Al, and is made of, for example, a material represented by $Al_xGa_{1-x}N$ ($0<x\leq1$). Further, the Al nitride semiconductor layer 4 may be made of a material expressed by $Al_xIn_yGa_{1-x-y}N$ ($0<x\leq1$, $0\leq y<1$). Al nitride semiconductor layer 4 functions as a buffer layer to alleviate lattice constant difference between AlN buffer layer 3 and GaN layer 5. For example, the Al nitride semiconductor layer 4 has a thickness of 500 nm or more and 2 μm or less, preferably 900 nm or more and 2 μm or less. Al nitride semiconductor layer 4 is formed by using, for example, an MOCVD method.

The GaN layer 5 is in contact with the Al nitride semiconductor layer 4 and is formed on the Al nitride semiconductor layer 4. GaN layer 5 is undoped. The GaN layer 5 has a thickness of, for example, 500 nm or more and 1000 nm or less, preferably 550 nm or more and 1000 nm or less (more preferably 800 nm or less). Note that the GaN layer 5 may be semi-insulating and may have a conductivity type of p-type or n-type.

The GaN layer 5 is formed by using, for example, an MOCVD method. In this case, as the Ga source gas, for example, TMG (Tri Methyl Gallium), TEG (Tri Ethyl Gallium), or the like is used. As N source gas, for example, $NH_3$ or the like is used.

The AlN intermediate layer 6 is in contact with the GaN layer 5 and formed on the GaN layer 5. The AlN intermediate layer 6 functions to generate a compressive strain in the GaN layer 7. The AlN intermediate layer 6 has a thickness of, for example, 5 nm or more and 15 nm or less, preferably 5 nm or more and 9 nm or less, more preferably 7 nm or more and 9 nm or less. The AlN intermediate layer 6 is formed by using, for example, an MOCVD method. The AlN intermediate layer 6 is formed with a lower growth temperature than the growth temperature of the GaN layer 5.

The GaN layer 7 is in contact with the AlN intermediate layer 6 and is formed on the AlN intermediate layer 6. GaN layer 7 is undoped and semi-insulating. GaN layer 7 acts as an electron transition layer of the HEMT. The GaN layer 7 contains a compressive strain due to the influence from the AlN intermediate layer 6 which is the foundation layer. The GaN layer 7 preferably has a thickness of 1500 nm or more and 3000 nm or less, and more preferably has a thickness of 1500 nm or more and 2500 nm or less. The GaN layer 7 is formed in the same way as the GaN layer 5. Note that the GaN layer 7 may have p-type or n-type conductivity, and at least a part of the GaN layer 7 may be doped with C.

The Al nitride semiconductor layer 10 is in contact with the GaN layer 7 and is formed on the GaN layer 7. The Al nitride semiconductor layer 10 is made of a nitride semiconductor containing Al, and is made of, for example, a material represented by $Al_1Ga_{1-x}N$ ($0<x\leq1$). In addition, the Al nitride semiconductor layer 10 may be made of a material represented by $Al_xIn_yGa_{1-x-y}N$ ($0<x\leq1$, $0\leq y<1$). Al nitride semiconductor layer 10 acts as a barrier layer of the HEMT. For example, the Al nitride semiconductor layer 10 has a thickness of 10 nm or more and 50 nm or less.

Figure 2:
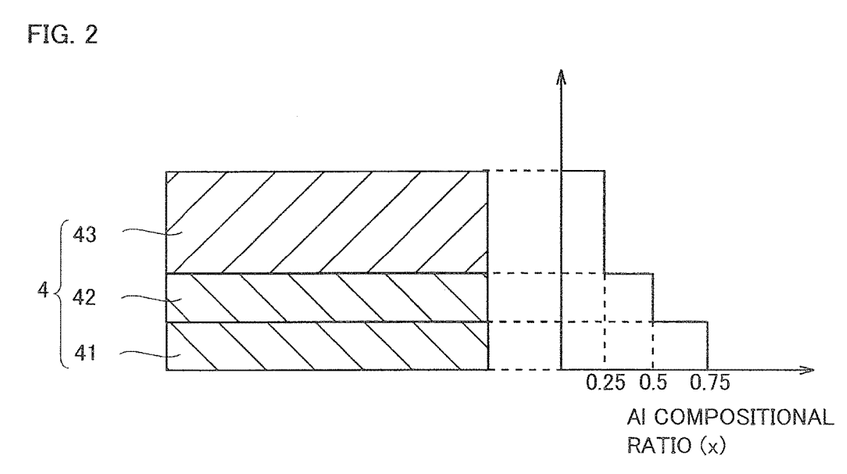
FIG. 2 is a diagram showing a distribution of an Al compositional ratio inside an Al nitride semiconductor layer 4, according to an embodiment of the present invention.

FIG. 2 is a diagram showing a distribution of Al compositional ratio inside the Al nitride semiconductor layer 4, in an embodiment of the present invention.

Referring to FIG. 2, the compositional ratio of Al inside the Al nitride semiconductor layer 4 decreases from the bottom toward the top. The Al nitride semiconductor layer 4 includes $Al_{0.75}Ga_{0.25}N$ layer 41 (an AlGaN layer having Al compositional ratio of 0.75), $Al_{0.5}Ga_{0.5}N$ layer 42 (an AlGaN layer having Al compositional ratio of 0.5), and $Al_{0.5}Ga_{0.75}N$ layer 43 (an AlGaN layer having Al compositional ratio of 0.25). The $Al_{0.75}Ga_{0.25}N$ layer 41 is formed on the AlN buffer layer 3, in contact with the AlN buffer layer 3. The $Al_{0.5}Ga_{0.5}N$ layer 42 contacts the $Al_{0.75}Ga_{0.25}N$ layer 41 and is formed on the $Al_{0.75}Ga_{0.25}N$ layer 41. The $Al_{0.5}Ga_{0.75}N$ layer 43 contacts the $Al_{0.5}Ga_{0.5}N$ layer 42 and is formed on the $Al_{0.5}Ga_{0.5}N$ layer 42. The Al compositional ratio is an example, and if the Al compositional ratio decreases from the lower part to the upper part, it can be another composition.

According to the present embodiment, occurrence of warpage of Si substrate 1 can be suppressed and occurrence of crack in GaN layer 7 can be suppressed, by forming the AlN intermediate layer 6 between the GaN layer 5 and the GaN layer 7. This will be described below.

AlN constituting the AlN intermediate layer 6 epitaxially grows on the GaN layer 5 in an unconformity state (sliding state) with respect to the crystal of GaN constituting the GaN layer 5. On the other hand, the GaN constituting the GaN layer 7 is influenced by the crystal of AlN constituting the foundation AlN intermediate layer 6. That is, the GaN constituting the GaN layer 7 epitaxially grows on the AlN intermediate layer 6, so as to take over the crystal structure of AlN constituting the AlN intermediate layer 6. Since the lattice constant of GaN is larger than the lattice constant of AlN, the lattice constant in the horizontal direction in FIG. 1 of the GaN constituting the GaN layer 7 becomes smaller than the lattice constant of general GaN (not including compressive strain). In other words, a compressive strain is generated inside the GaN layer 7.

When the temperature decreases after forming the GaN layer 7, the GaN layer 7 receives stress from the AlN intermediate layer 6, due to the difference in the coefficient of thermal expansion between GaN and Si. This stress causes generation of warpage of Si substrate 1 and generation of crack to GaN layer 7. However, this stress is relaxed by the compressive strain introduced into the GaN layer 7 when the GaN layer 7 is formed. As a result, occurrence of warpage of Si substrate 1 can be suppressed, and occurrence of crack in GaN layer 7 can be suppressed.

Further, according to the present embodiment, since the compound semiconductor substrate CS includes an Al nitride semiconductor layer 4 between the AlN buffer layer 3 and the GaN layer 5, the difference between the lattice constant of Si and the lattice constant of GaN can be relaxed. Because the lattice constant of Al nitride semiconductor layer 4 has a value between the lattice constant of Si and the lattice constant of GaN. As a result, the crystal quality of the GaN layer 5 can be improved. In addition, occurrence of warpage of Si substrate 1 can be suppressed, and occurrence of crack to GaN layer 5 can be suppressed.

Further, according to the present embodiment, each of the GaN layers 5 and 7 can be thickened, since occurrence of warpage of the Si substrate 1 and occurrence of cracks in the GaN layers 5 and 7 are suppressed, as described above. Also, the compound semiconductor substrate CS contains an Al nitride semiconductor layer 4 with an insulation breakdown voltage higher than the insulation breakdown voltage of GaN. As a result, the withstand voltage in the longitudinal direction of the compound semiconductor substrate can be improved.

In addition, the compound semiconductor substrate CS contains SiC layer 2 as the foundation layer of GaN layers 5 and 7. Since the lattice constant of SiC is closer to the lattice constant of GaN than Si lattice constant, the crystal quality of the GaN layers 5 and 7 can be improved, by forming the GaN layers 5 and 7 on the SiC layer 2.

As described above, according to the present embodiment, by separating the function of each of AlN intermediate layer 6, Al nitride semiconductor layer 4, and SiC layer 2, the effect of suppressing occurrence of warpage of Si substrate 1 and occurrence of crack in GaN layers 5 and 7, the effect of improving withstand voltage of the compound semiconductor substrate, and the effect of improving crystal quality of GaN layers 5 and 7 can be increased. In particular, the present embodiment contributes greatly to improve the crystal quality of GaN layers 5 and 7, by adopting the SiC layer 2 as the foundation layer.

According to the present embodiment, since there is the SiC layer 2, and the crystal quality of GaN layer 5 is improved, it is possible to reduce the thickness of the AlN intermediate layer 6 and to suppress occurrence of warpage and occurrence of crack more efficiently. Further, since there is the SiC layer 2, and the crystal quality of the GaN layer 5 is improved, GaN layers 5 and 7 can be thickened to improve the withstand voltage furthermore.

On the other hand, in the prior art documents 2 and 3, the AlGaN layer is formed between the AlN layer and the GaN layer. In this structure, the difference between the lattice constant of AlN and the lattice constant of GaN can be relaxed by the AlGaN layer, and the crystal quality of the GaN layer can be improved. The GaN constituting the GaN layer epitaxially grows on the AlGaN layer so as to take over the crystal structure of AlGaN constituting the AlGaN layer. However, since the lattice constant of AlGaN is closer to the lattice constant of GaN than the lattice constant of AlN, the compressive strain occurring inside the GaN layer is smaller than when forming a GaN layer on an AlN layer as a foundation layer. As a result, the effect of suppressing the occurrence of warpage of Si substrate is small, and the effect of suppressing the occurrence of cracks in the GaN layer is small. Further, it is not possible to thicken the GaN layer, and it is not possible to improve the vertical withstand voltage of the compound semiconductor substrate.

In other words, in this structure, since the effect of improving crystal quality, the effect of suppressing the occurrence of warpage of the Si substrate, and the effect of suppressing the occurrence of cracks in the GaN layer are caused by one layer (the AlGaN layer), each effect is reduced.

The inventors of the present invention carried out the following experiments, to confirm the effect caused by the compound semiconductor substrate CS which contains AlN intermediate layer 6.

Figure 3:
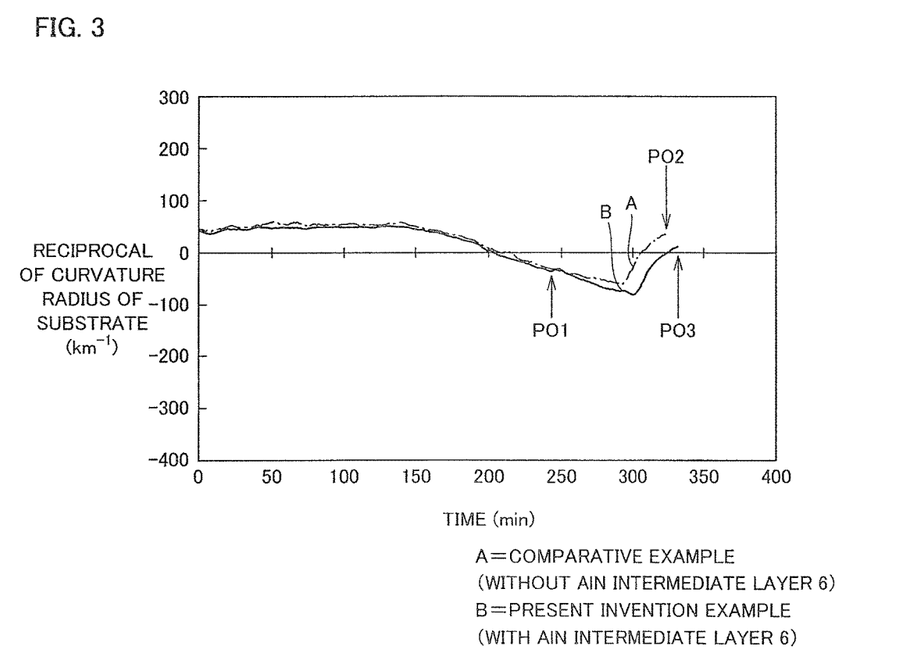
FIG. 3 is a diagram showing a measurement result of time change of reciprocal of curvature radius of a substrate, during production of compound semiconductor substrate CS.

FIG. 3 is a diagram showing the measurement result of the time change of the reciprocal of the curvature radius of the substrate, at the time of manufacturing the compound semiconductor substrate CS. Note that plus of the reciprocal of the curvature radius in FIG. 3 shows the state where the GaN layer 7 surface is concave, and minus of the reciprocal of the curvature radius in FIG. 3 shows the state where the GaN layer 7 surface is convex. In FIG. 3, the closer the reciprocal of the curvature radius of the substrate is to zero, the warpage of the substrate is reduced.

Referring to FIG. 3, the inventors of the present invention sequentially formed each layer constituting a compound semiconductor substrate CS on a substrate as an example of the present invention, and measured the time change of reciprocal of the curvature radius of the substrate. In addition, as a comparative example, the inventors of the present invention sequentially formed each layer excluding the AlN intermediate layer 6 among the layers constituting the compound semiconductor substrate CS on the substrate, and measured the time change of the reciprocal of the curvature radius of the substrate.

As a result, the warpage of the substrate of the present invention greatly increased in the minus direction, as compared with the warpage of the substrate of the comparative example, after the time PO1 when the AlN intermediate layer 6 was formed in the example of the present invention. From this result, it can be seen that compressive strain is generated in the GaN layer 7, due to the existence of the AlN intermediate layer 6.

Also, the final reciprocal of curvature radius of the substrate (reciprocal of curvature radius at time PO3) in the example of the present invention is obviously small, as compared to the final reciprocal of curvature radius of the substrate (reciprocal of curvature radius at time PO2) in the comparative example. From this result, it can be seen that the occurrence of the warpage of the substrate is suppressed by the existence of the AlN intermediate layer 6.

[Modification]

Figure 4:
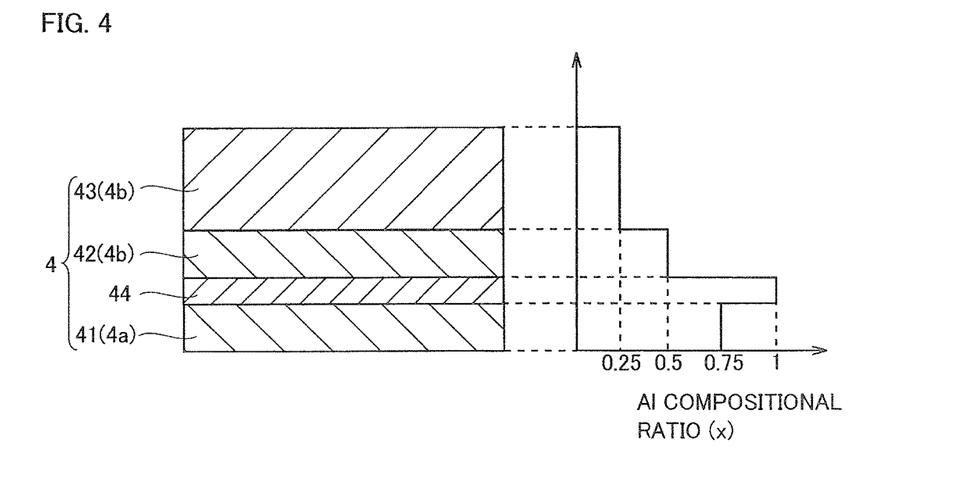
FIG. 4 is a diagram showing a distribution of an Al compositional ratio inside an Al nitride semiconductor layer 4, according to a first modification of the present invention.

FIG. 4 is a diagram showing a distribution of Al compositional ratio inside the Al nitride semiconductor layer 4, in the first modification of the present invention.

Referring to FIG. 4, the Al nitride semiconductor layer 4 in this modification includes an AlGaN layer 4a (an example of a first nitride semiconductor layer containing Al and Ga), an AlN intermediate layer 44 (an example of a second AlN layer), and an AlGaN layer 4b (an example of a second nitride semiconductor layer containing Al and Ga).

The AlGaN layer 4a contacts the AlN buffer layer 3 and is formed on the AlN buffer layer 3. The AlGaN layer 4a is composed of an $Al_{0.75}Ga_{0.20}N$ layer 41 (an AlGaN layer having Al compositional ratio of 0.75). The compositional ratio of Al inside AlGaN layer 4a is constant.

The AlN intermediate layer 44 is formed on the AlGaN layer 4a. The lower surface of the AlN intermediate layer 44 is in contact with the upper surface of the AlGaN layer 4a, and the upper surface of the AlN intermediate layer 44 is in contact with the lower surface of the AlGaN layer 4b.

The AlGaN layer 4b is formed on the AlN intermediate layer 44. The compositional ratio of Al inside the AlGaN layer 4b decreases from the bottom toward the top. The AlGaN layer 4b is composed of an $Al_{0.5}Ga_{0.5}N$ layer 42 (an AlGaN layer having Al compositional ratio of 0.5), and an $Al_{0.25}Ga_{0.5}N$ layer 43 (an AlGaN layer having Al compositional ratio of 0.25) formed on the $Al_{0.5}Ga_{0.5}N$ layer 42, in contact with the $Al_{0.5}Ga_{0.5}N$ layer 42.

Figure 5:
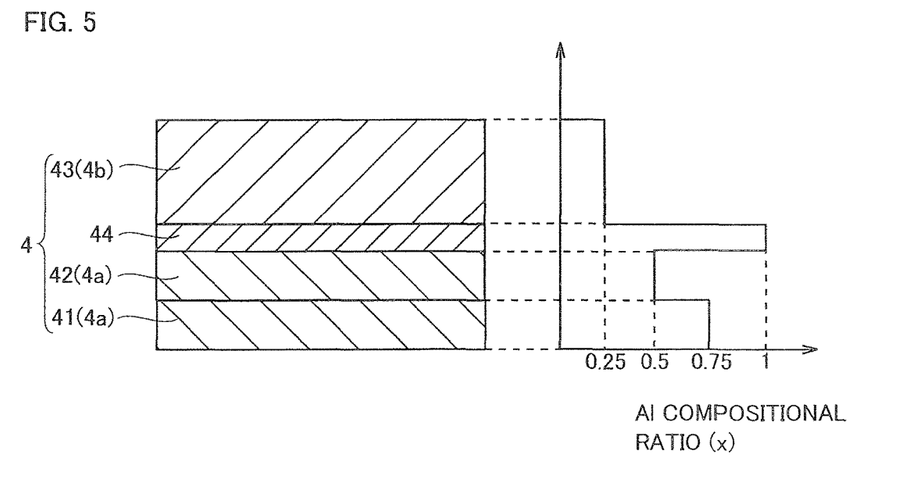
FIG. 5 is a diagram showing a distribution of an Al compositional ratio inside an Al nitride semiconductor layer 4, according to a second modification of the present invention.

FIG. 5 is a diagram showing the distribution of Al compositional ratio inside the Al nitride semiconductor layer 4, in the second modification of the present invention.

Referring to FIG. 5, an Al nitride semiconductor layer 4 in this modification includes an AlGaN layer 4a (an example of a first nitride semiconductor layer containing Al and Ga), an AlN intermediate layer 44 (an example of a second AlN layer), and an AlGaN layer 4b (an example of a second nitride semiconductor layer including Al and Ga).

The AlGaN layer 4a contacts the AlN buffer layer 3 and is formed on the AlN buffer layer 3. The compositional ratio of Al inside AlGaN layer 4a decreases from the bottom toward the top. The AlGaN layer 4a is composed of an $Al_{0.7}Ga_{0.25}N$ layer 41 (an AlGaN layer having Al compositional ratio of 0.75), and an $Al_{0.5}Ga_{0.5}N$ layer 42 (an AlGaN layer having Al compositional ratio of 0.5) formed on the $Al_{0.75}Ga_{0.25}N$ layer 41 in contact with the $Al_{0.75}Ga_{0.25}N$ layer 41.

The AlN intermediate layer 44 is formed on the AlGaN layer 4a. The lower surface of the AlN intermediate layer 44 is in contact with the upper surface of the AlGaN layer 4a, and the upper surface of the AlN intermediate layer 44 is in contact with the lower surface of the AlGaN layer 4b.

The AlGaN layer 4b is formed on the AlN intermediate layer 44. The AlGaN layer 4b is made of an $Al_{0.25}Ga_{0.75}N$ layer 43 (an AlGaN layer having Al compositional ratio of 0.25). The compositional ratio of Al inside the AlGaN layer 4b is constant.

Since the configuration other than the above in each of the compound semiconductor substrates of the first modification and the second modification is the same as the configuration in the above-described embodiment, the explanation will not be repeated.

The AlN intermediate layer 44 functions to generate a compressive strain in the AlGaN layer 4b. As in the first and second modifications, warpage and crack is suppressed by providing the AlN intermediate layer 44.

[Others]

The device formed in the compound semiconductor substrate may be an arbitrary device, and it may be a transistor, an LED (light emitting diode), a thyristor, a semiconductor laser, or the like, other than an HEMT. The compound semiconductor substrate is suitable for the application of electric devices.

The above-described embodiments are to be considered in all respects as illustrative and not restrictive. The scope of the present invention is defined not by the description above but by the claims, and it is intended that all variations within the claims and the meaning and the scope of the equivalent are included.

DESCRIPTION OF REFERENCE NUMBER

1 Si (silicon) substrate
2 SiC (silicon carbide) layer
3 AlN (aluminum nitride) buffer layer
4, 10 Al (aluminum) nitride semiconductor layer

4a, 4b AlGaN (aluminum gallium nitride) layer
5, 7 GaN (gallium nitride) layer
6, 44 AlN intermediate layer
41 $Al_{0.75}Ga_{0.25}N$ layer
42 $Al_{0.5}Ga_{0.5}N$ layer
43 $Al_{0.25}Ga_{0.75}N$ layer
CS compound semiconductor substrate

What is claimed is:

1. A compound semiconductor substrate comprising:
   an SiC layer,
   an AlN buffer layer formed on the SiC layer,
   a nitride semiconductor layer containing Al, formed on the AlN buffer layer,
   a first GaN layer formed on the nitride semiconductor layer,
   a first AlN intermediate layer formed on the first GaN layer, being in contact with the first GaN layer, and
   a second GaN layer formed on the first AlN intermediate layer, being in contact with the first AlN intermediate layer,
   wherein the nitride semiconductor layer includes
   a first nitride semiconductor layer containing Al and Ga,
   a second AlN layer formed on the first nitride semiconductor layer, being in contact with the first nitride semiconductor layer, and
   a second nitride semiconductor layer containing Al and Ga, formed on the second AlN layer and being in contact with the second AlN layer,
   wherein a compositional ratio of Al in at least one of the first and second nitride semiconductor layers decreases from a lower part to an upper part of the nitride semiconductor layer.

2. The compound semiconductor substrate according to claim 1, wherein
   the second GaN layer includes compressive strain.

3. The compound semiconductor substrate according to claim 1, wherein
   the nitride semiconductor layer has a thickness of 900 nm or more and 2 μm or less.

4. The compound semiconductor substrate according to claim 1, wherein
   the first GaN layer has a thickness of 550 nm or more and 1000 nm or less.

5. The compound semiconductor substrate according to claim 1, wherein
   the first AlN intermediate layer has a thickness of 5 nm or more and 9 nm or less.

* * * * *